US012715338B2

(12) United States Patent
Neuman et al.

(10) Patent No.: US 12,715,338 B2
(45) Date of Patent: Aug. 25, 2026

(54) DIAGNOSING AND LOCATING BATTERY PACK FAILURES

(71) Applicant: GM GLOBAL TECHNOLOGY OPERATIONS LLC, Detroit, MI (US)

(72) Inventors: Christopher Neuman, Denver, CO (US); Andres Victor Mituta, Lake Orion, MI (US); James Routh, Oak Ridge, TN (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 78 days.

(21) Appl. No.: 18/750,953

(22) Filed: Jun. 21, 2024

(65) Prior Publication Data

US 2025/0388124 A1 Dec. 25, 2025

(51) Int. Cl.

| | |
|---|---|
| ***B60L 58/21*** | (2019.01) |
| ***G01R 31/36*** | (2020.01) |
| ***G01R 31/3835*** | (2019.01) |
| ***G01R 31/396*** | (2019.01) |
| ***H01M 10/48*** | (2006.01) |

(52) U.S. Cl.

CPC .......... *B60L 58/21* (2019.02); *G01R 31/3646* (2019.01); *G01R 31/3835* (2019.01); *G01R 31/396* (2019.01); *H01M 10/482* (2013.01)

(58) Field of Classification Search

CPC ... B60L 58/21; G01R 31/396; G01R 31/3646; H01M 10/482

See application file for complete search history.

(56) References Cited

U.S. PATENT DOCUMENTS

| | | | | |
|---|---|---|---|---|
| 2013/0113495 | A1* | 5/2013 | Kim | G01R 31/382 324/434 |
| 2021/0055356 | A1* | 2/2021 | Stafl | B60L 3/0046 |
| 2022/0283231 | A1 | 9/2022 | Ham et al. | |
| 2023/0017485 | A1* | 1/2023 | Han | G01R 31/52 |
| 2023/0168314 | A1* | 6/2023 | Furukawa | G01R 31/396 |

FOREIGN PATENT DOCUMENTS

| | | |
|---|---|---|
| DE | 102020214562 A1 | 5/2022 |

OTHER PUBLICATIONS

German Office Action from counterpart DE1020241233036, dated May 5, 2025.

U.S. Appl. No. 18/530,475, filed Dec. 6, 2023, Neuman et al.

* cited by examiner

*Primary Examiner* — Peter D Nolan
*Assistant Examiner* — Matthew Cobb

(57) ABSTRACT

A vehicle system includes a battery pack including a plurality of battery cells, a voltage sensor configured to sense an output voltage of the plurality of battery cells, and a control module in communication with the voltage sensor. The control module is configured to detect a failure associated with the battery pack, receive, from the voltage sensor, a first voltage signal representing a first voltage value and a second voltage signal representing a second voltage value, determine a defined ratio of the first voltage value and the second voltage value, determine a battery cell location of the detected failure in the battery pack based on the defined ratio and a total number of the plurality of battery cells in the battery pack, and generate an alert indicating the battery cell location of the detected failure. Other example vehicle systems and methods are also disclosed.

20 Claims, 7 Drawing Sheets

DIAGNOSING AND LOCATING BATTERY PACK FAILURES

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to diagnosing and locating battery pack failures, and more particularly to diagnosing and locating battery pack failures in rechargeable energy storage systems of vehicles.

Electric vehicles, such as battery electric vehicles, hybrid vehicles, and/or fuel cell vehicles, include one or more electric machines and a battery system having one or more battery cells, modules, and/or packs. For example, the battery system may be a rechargeable energy storage system including one or more high voltage battery packs each having a collection of battery cells. Commonly, one or more of the battery packs in the rechargeable energy storage system are electrically isolated from components outside of the battery pack.

SUMMARY

A vehicle system for detecting a failure in a battery pack, includes a battery pack including a plurality of battery cells, a voltage sensor configured to sense an output voltage of the plurality of battery cells, and a control module in communication with the voltage sensor. The control module is configured to detect a failure associated with the battery pack, receive, from the voltage sensor, a first voltage signal representing a first voltage value and a second voltage signal representing a second voltage value, determine a defined ratio of the first voltage value and the second voltage value, determine a battery cell location of the detected failure in the battery pack based on the defined ratio and a total number of the plurality of battery cells in the battery pack, and generate an alert indicating the battery cell location of the detected failure.

In other features, the first voltage value is a negative mid pack voltage of the battery pack and the second voltage value is a positive mid pack voltage of the battery pack.

In other features, the control module is configured to determine slopes of the first voltage signal and the second voltage signal, and in response to the slopes being less than or equal to a defined threshold, measure the negative mid pack voltage of the battery pack from the first voltage signal and the positive mid pack voltage of the battery pack from the second voltage signal.

In other features, the control module is configured to determine the defined ratio of the first voltage value and the second voltage value by dividing the negative mid pack voltage by the sum of the negative mid pack voltage and the positive mid pack voltage.

In other features, the control module is configured to determine the battery cell location by multiplying the defined ratio by the total number of the plurality of battery cells in the battery pack.

In other features, the battery pack includes cell groups each comprising a different set of the battery cells.

In other features, the control module is configured to determine the defined ratio of the first voltage value and the second voltage value by summing a cell group voltage for a select amount of the cell groups and dividing the summed cell group voltage by the sum of the negative mid pack voltage and the positive mid pack voltage.

In other features, the select amount of the cell groups is determined based on the negative mid pack voltage.

In other features, the control module is configured to determine the battery cell location by multiplying the defined ratio by the total number of the plurality of battery cells in the battery pack.

In other features, the voltage sensor includes a voltage divider having a plurality of resistors, the vehicle system further includes a switching device coupled to the voltage divider, and the control module is configured to control the switching device to connect different sets of the plurality of resistors in the voltage divider.

In other features, the battery cell location is a first battery cell location, and the control module is configured to determine a second battery cell location of the detected failure in the battery pack after determining the first battery cell location, and identify a type of the failure associated with the battery pack based on the first battery cell location and the second battery cell location.

In other features, the control module is configured to determine whether the first battery cell location and the second battery cell location are the same, in response to the first battery cell location and the second battery cell location being the same, identify the type of the failure associated with the battery pack as being a first type of the failure, and in response to the first battery cell location and the second battery cell location being different, identify the type of the failure associated with the battery pack as being a second type of the failure.

A method for detecting a failure in a battery pack including a plurality of battery cells, includes detecting a failure associated with the battery pack, receiving, from a voltage sensor, a first voltage signal representing a first voltage value of the battery pack and a second voltage signal representing a second voltage value of the battery pack, determining a defined ratio of the first voltage value and the second voltage value, determining a battery cell location of the detected failure in the battery pack based on the defined ratio and a total number of the plurality of battery cells in the battery pack, and generating an alert indicating the battery cell location of the detected failure.

In other features, the first voltage value is a negative mid pack voltage of the battery pack and the second voltage value is a positive mid pack voltage of the battery pack.

In other features, the method further includes determining slopes of the first voltage signal and the second voltage signal, and in response to the slopes being less than or equal to a defined threshold, measuring the negative mid pack voltage of the battery pack from the first voltage signal and the positive mid pack voltage of the battery pack from the second voltage signal.

In other features, determining the defined ratio of the first voltage value and the second voltage value includes dividing the negative mid pack voltage by the sum of the negative mid pack voltage and the positive mid pack voltage.

In other features, determining the battery cell location of the detected failure includes multiplying the defined ratio by the total number of the plurality of battery cells in the battery pack.

In other features, the battery pack includes cell groups each comprising a different set of the battery cells.

In other features, determining the defined ratio of the first voltage value and the second voltage value includes summing a cell group voltage for a select amount of the cell groups and dividing the summed cell group voltage by the sum of the negative mid pack voltage and the positive mid pack voltage.

In other features, determining the battery cell location of the detected failure includes multiplying the defined ratio by the total number of the plurality of battery cells in the battery pack.

In other features, the battery cell location is a first battery cell location, and the method further includes determining a second battery cell location of the detected failure in the battery pack and identifying a type of the failure associated with the battery pack based on the first battery cell location and the second battery cell location.

In other features, generating the alert includes generating the alert includes indicating the type of the failure associated with the battery pack.

In other features, the first battery cell location and the second battery cell location are determined at different times, and the method further includes determining whether the first battery cell location and the second battery cell location are the same.

In other features, identifying the type of the failure associated with the battery pack includes identifying a first type of the failure associated with the battery pack in response to the first battery cell location and the second battery cell location being the same or identifying a second type of the failure associated with the battery pack in response to the first battery cell location and the second battery cell location being different.

A method includes detecting a failure associated with a battery pack including a plurality of battery cells, determining N battery cell locations of the detected failure in the battery pack over time, where N is an integer greater than two, identifying a type of the failure associated with the battery pack based on the N battery cell locations, and generating an alert indicating the type of the failure associated with the battery pack.

In other features, the N battery cell locations include at least a first battery cell location and a second battery cell location, and the method further includes determining whether the first battery cell location and the second battery cell location are the same.

In other features, identifying the type of the failure associated with the battery pack includes identifying a first type of the failure associated with the battery pack in response to the first battery cell location and the second battery cell location being the same or identifying a second type of the failure associated with the battery pack in response to the first battery cell location and the second battery cell location being different.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
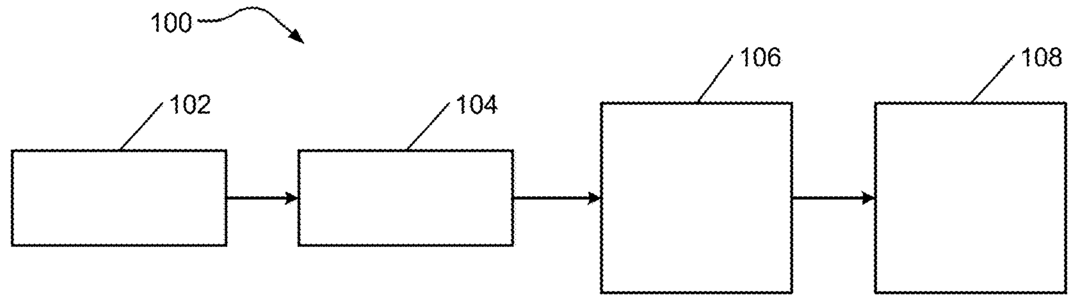
FIG. 1 is a block diagram of an example system for detecting a location failure and identifying a failure mode in a battery pack, according to the present disclosure.

A vehicle, such as an electrical vehicle (EV) often relies on a rechargeable energy storage system (RESS) for storing and supplying power to propel the vehicle. In such examples, the RESS includes one or more high voltage battery packs each having a collection of battery cells. In some examples, battery cells may be located in modules in each battery pack. In the RESS, one or more of the battery packs are electrically isolated from components outside of the battery packs, such as the vehicle's chassis. With this configuration, the RESS or components thereof are coupled to high voltage components without being grounded to, for example, the vehicle's chassis. In other words, the RESS or components thereof are electrically isolated from the vehicle's chassis. In such examples, the vehicle relies on a floating ground with respect to the RESS. Sometimes, conditions arise in the RESS and/or other high voltage components causing a loss of isolation. However, discerning between different failures in the RESS due to isolation loss and/or identifying cell locations of such failures is difficult, and often requires deconstructing the RESS for analysis.

The systems and methods according to the present disclosure provide solutions for identifying a cell location of a failure in a battery pack, such as a high voltage battery pack in a vehicle. For example, if isolation loss is detected in a vehicle and a failure associated with a battery pack in the vehicle occurs, the systems and methods herein determine where a voltage loss to vehicle chassis is occurring. For instance, and as further explained below, the systems and methods herein enable the determination of a battery cell location of a failure in a battery pack based on sensed voltage values associated with the battery pack. Then, once the battery cell location is determined, an alert may be generated providing details (e.g., a cell number, a cell group, etc.) of the battery cell location. Users, such as technicians, may then rely on this alert to provide remedial actions. For example, given the battery cell location of the failure in the battery pack, a technician may quickly identify and locate the location of issues within the battery pack by narrowing a loss of isolation to a particular battery cell or battery module with multiple cells, rather than generically to the entire battery pack. This in turn enables a speedy replacement of individual battery cells or battery modules that have issues derived from and/or caused by the isolation loss, such as cell corrosion, foreign body contaminants, etc.

Additionally, in some embodiments, the systems and methods herein provide solutions for discerning between different types of failure modes within the battery pack due to the isolation loss. For example, and as further explained below, different types of failure modes may be identified by monitoring the location of the failure over multiple cycles. For instance, the systems and methods herein may identify the failure as a particular failure mode, such as a coolant leak, water intrusion, etc. if the failure location is dynamic, moving over a larger area in the battery pack. However, if the failure location is relatively static, remaining substantially in the same area (e.g., same cell location) in the battery pack, the systems and methods herein may identify the failure as another failure mode, such as corrosion, an electrolyte leak, etc. Then, once identified, the alert may provide details pertaining to the failure type. In turn, the severity of the isolation loss may be determined with a high degree of confidence based on the identified failure type. As a result, users gain valuable information and increased confidence in whether to set a diagnostic trouble code (DTC) associated with the isolation loss and in determining an appropriate remedial action.

Referring now to FIG. 1, a block diagram of an example system 100 is presented for detecting a location failure and identifying a failure mode in a battery pack. As shown in FIG. 1, the system 100 generally includes a battery pack 102, a voltage sensor 104 for sensing an output voltage of the battery pack 102, a control module 106, and an alert module 108. As shown, the control module 106 is in communication with the voltage sensor 104 and the alert module 108.

Although FIG. 1 illustrates the system 100 as including specific dedicated modules, it should be appreciated that one or more other modules may be employed if desired. For example, any combination of the modules (e.g., the control module 106, the alert module 108, etc.) and/or the functionality thereof may be integrated into a single module or multiple different modules. Additionally, while the system 100 is shown as including one battery pack 102, it should be appreciated that the system 100 may include multiple battery packs. Regardless of the number of battery packs in the system 100, the single battery pack or multiple battery packs may be part of a RESS.

In various embodiments, the modules and sensors of the system 100 may be in communication with each other and may share parameters via a network, such as a controller area network (CAN). In such examples, the parameters may be shared via one or more data buses of the network. As such, various parameters may be made available by a given module and/or sensor to other modules and/or sensors via the network.

Figure 2:
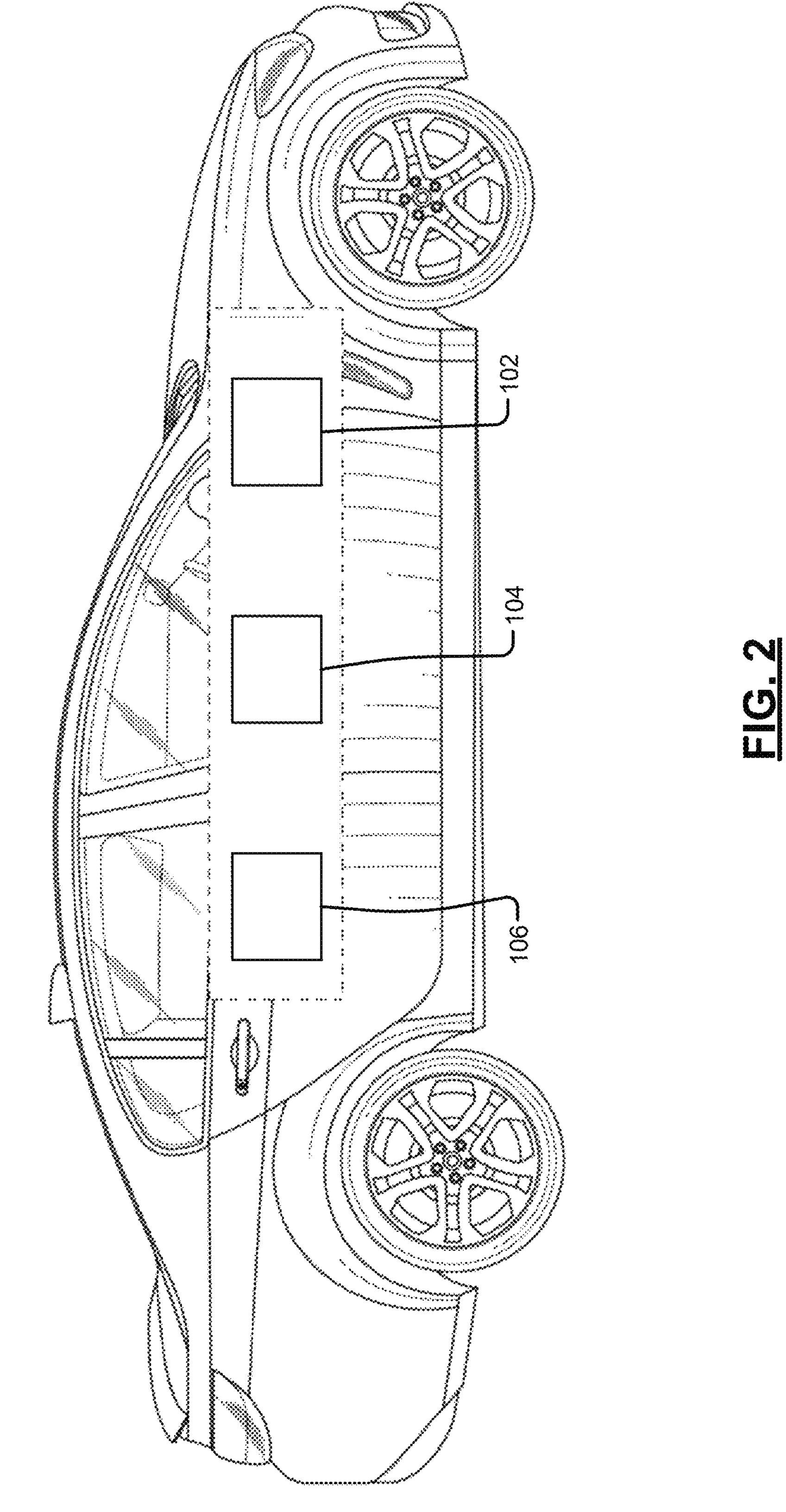
FIG. 2 is a vehicle including portions of the system of FIG. 1, according to the present disclosure.

The system 100 of FIG. 1 may be employable in any suitable implementation in which one or more high voltage battery packs are employed. For example, the system 100 may be employed in vehicles implementations or non-vehicles implementations. Further, if the system 100 may be employed in a vehicle implementation, the system 100 may be positioned in a vehicle or in another suitable location, such as at a testing facility (e.g., a service location, a manufacturing location, etc.). If the system 100 is positioned and implemented within a vehicle, the functions for detecting a location failure and a failure mode in the battery pack 102 (as further explained herein) are executed while the vehicle is not moving to minimize noise. With respect to vehicles implementations, the system 100 may be a part of any suitable vehicle having a RESS including one or more high voltage battery packs for storing and supply power to propelling the vehicle. In such examples, the vehicle may be an electric vehicle, such as a pure electric vehicle, a hybrid electric vehicle, etc. Additionally, the system 100 may be applicable to an autonomous vehicle, a semi-autonomous vehicle, etc. As one example, FIG. 2 depicts a vehicle 200 including the battery pack 102, the voltage sensor 104, and the control module 106 of FIG. 1.

Figure 3:
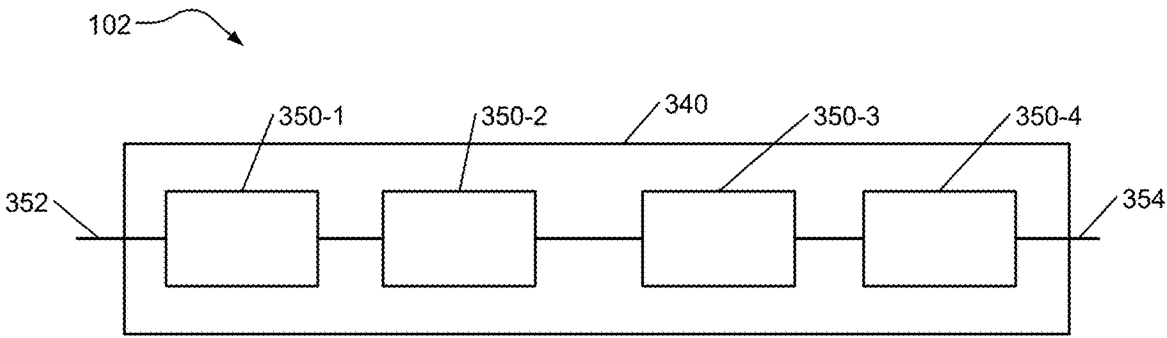
FIG. 3 is a block diagram of an example battery pack of the system in FIG. 1, according to the present disclosure.

With continued reference to FIG. 1, the battery pack 102 generally includes multiple battery cells. In such examples, each battery cell may be capable of storing and supplying power. In various embodiments, a defined collection of battery cells may form a battery group or battery module, each of which may be selectively removed or replaced with another battery group. For example, FIG. 3 depicts one example of the battery pack 102 of FIG. 1. As shown in FIG. 3, the battery pack 102 includes a battery enclosure 340, cell groups (indicated generally by 350) positioned within the battery enclosure 340, and battery leads 352, 354 coupled to the cell groups. In such examples, the cell groups include any suitable number of cell groups. For instance, in FIG. 3, the battery pack 102 includes four cell groups 350-1, 350-2, 350-3, 350-4. In other examples, the battery pack 102 may include one includes one cell group, two cell groups, five cell groups, ten cell groups, sixteen cell groups, twenty-four cell groups, etc. Regardless of the number of cell groups, the battery leads 352, 354 electrically connect the battery pack 102 (e.g., the cell groups 350-1, 350-2, 350-3, 350-4) to an output (e.g., a load), an input (e.g., a power supply), etc.

In various embodiments, the battery pack 102 of FIG. 1 may include battery cells or battery groups coupled in series and/or parallel configurations to obtain different high voltages. For example, the battery cells and/or battery groups may be coupled in manner to provide a high voltage, such as a suitable voltage over 50V (e.g., 100V, 400V, etc.). For instance, and shown in FIG. 2, the cell groups 350-1, 350-2, 350-3, 350-4 are coupled series.

Figure 4:
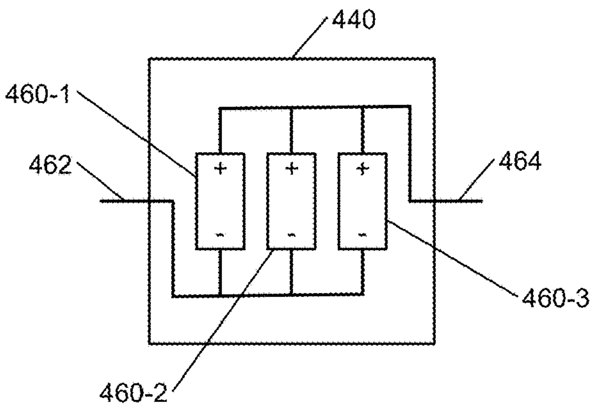
FIG. 4 is a block diagram of an example battery group of the battery pack in FIG. 3, according to the present disclosure.

Additionally, in some examples, the battery cells in any one of the battery groups may have a series and/or parallel configuration. For example, FIG. 4 depicts one example of the battery group 350-1 of FIG. 3. As shown in FIG. 4, the battery group 350-1 includes an enclosure 440, battery cells (indicated generally by 460) positioned within the enclosure 440, and leads 462, 464 coupled to the battery cells. In this example, the battery group 350-1 includes three battery cells 460-1, 460-2, 460-3 coupled in parallel. In other examples, the battery group 350-1 may include more or less battery cells (e.g., two battery cells, eight battery cells, twelve battery cells, thirty-six battery cells, forty-eight battery cells, ninety-six battery cells, etc.) coupled in series, a series/parallel configuration, etc. In the example of FIG. 4, the lead 462 may be equivalent to the battery leads 352 of FIG. 3 and the lead 464 may be coupled to the cell group 350-2 of FIG. 3.

In the example of FIG. 1, the voltage sensor 104 may be any suitable type of sensor for detecting voltages associated with the battery pack 102. For example, the voltage sensor 104 may sense an output voltage of the battery cells in the battery pack 102. In such examples, the voltage sensor 104 may provide one or more signals (e.g. voltage signals) to the control module 106 representing voltage values of the battery pack 102. In various embodiments, the voltage sensor 104 may be a voltage divider including multiple resistors and/or another suitable type of sensor.

With continued reference to FIG. 1, the control module 106 may generally detect a failure associated with the battery pack 102. For example, the control module 106 may passively or statistically detect an isolation loss associated with the battery pack 102. For instance, the control module 106 may receive a signal indicating the detection of the isolation loss from another module or system.

In other examples, the control module 106 may detect the isolation loss based on one or more sensed voltages from the voltage sensor 104. In such examples, the voltage sensor 104 may be leveraged both to detect the isolation loss and to determine a cell location of failure, as further explained herein. As such, the existing hardware (e.g., the voltage sensor 104, etc.) may be utilized to perform both functions. For example, the control module 106 may determine an isolation resistance based on sensed voltages from the voltage sensor 104, such as a negative mid pack voltage of the battery pack 102 and a positive mid pack voltage of the battery pack 102. In some examples, the control module 106 may cycle a bias switch to measure the isolation resistance when the switch is open. Generally, the control module 106 may generally detect the isolation loss if the isolation resistance falls below a threshold value, as is conventional.

In still other examples, the control module 106 may detect the isolation loss or otherwise determine that the isolation loss exists through one or more prediction-based algorithms. For example, in some examples, isolation resistance data from multiple operating battery packs (or multiple RESSs) may be obtained. Then, the control module 106 or another suitable module may predict whether an isolation loss associated with the battery pack 102 is present by relying on parameters learned from the isolation resistance data from the other battery packs. In such examples, suitable machine learning techniques, statistical modeling, etc. may be employed to learn the parameters (e.g., one or more thresholds) that are applied to detect an isolation loss associated with the battery pack 102.

Once the failure associated with the battery pack 102 is detected, the control module 106 receives voltage signals representing voltage values of the battery pack 102 from the voltage sensor 104. In various embodiments, the received voltage signals may represent a negative mid pack voltage and a positive mid pack volage of the battery pack 102, which may be measured in any suitable manner.

Figure 5:
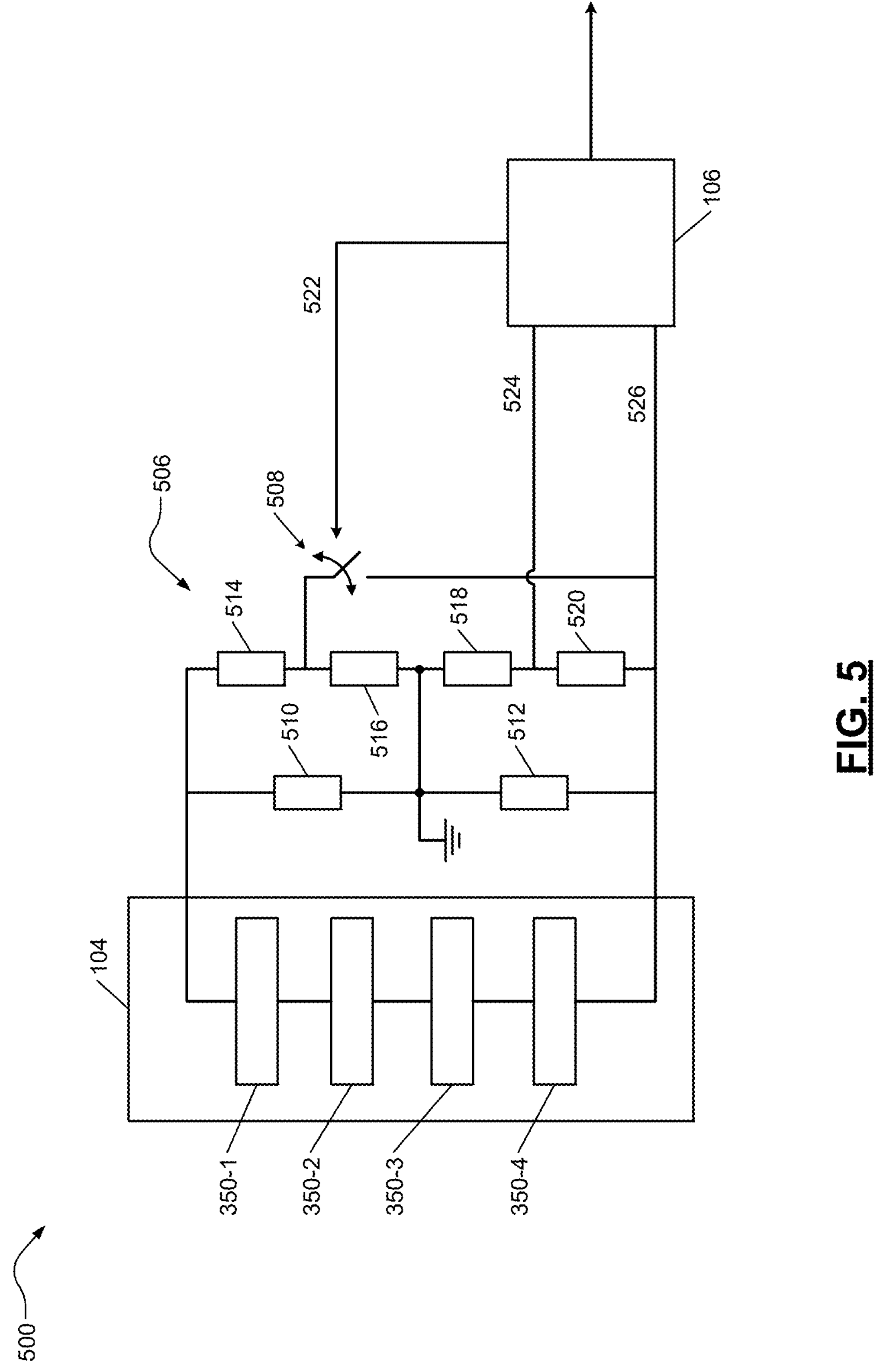
FIG. 5 is a block diagram of another example system for detecting a location failure and identifying a failure mode in a battery pack, according to the present disclosure.

For example, FIG. 5 depicts an example system 500 similar to the system 100. In FIG. 5, the system 500 includes the battery pack 102 of FIG. 1 having the cell groups 350-1, 350-2, 350-3, 350-4 of FIG. 3, the control module 106 of FIG. 1, a voltage sensor 506, and a switching device 508 coupled to the voltage sensor 506 and the control module 106. In the example of FIG. 5, the voltage sensor 506 includes resistors 510, 512, 514, 516, 518, 520 forming a switchable voltage divider configuration, and the switching device 508 functions as a bias switch used for determining an isolation resistance as explained above. In various embodiments, the voltage sensor 506 may be external to the battery pack 102 (as shown in FIG. 5) or internal to the battery pack if desired.

In the example of FIG. 5, different sets of the resistors 514, 516, 518, 520 may be connected together to generate the voltage values of the battery pack 102. In such examples, the control module 106 may control the switching device 508 to connect different sets of the resistors 514, 516, 518, 520 in the voltage divider. For example, in FIG. 5, the control module 106 generates a control signal 522 for controlling the switching device 508 to generate different pack voltage values with the voltage divider. For instance, when the switching device is open (e.g., not conducting), a negative mid pack voltage is produced and measured by the control module 106 between contacts 524, 526 based on the resistors 512, 518, 520. However, when the switching device is closed (e.g., conducting), a positive mid pack voltage is produced and measured by the control module 106 between contacts 524, 526 based on the resistors 510, 514, 516.

Figure 6:
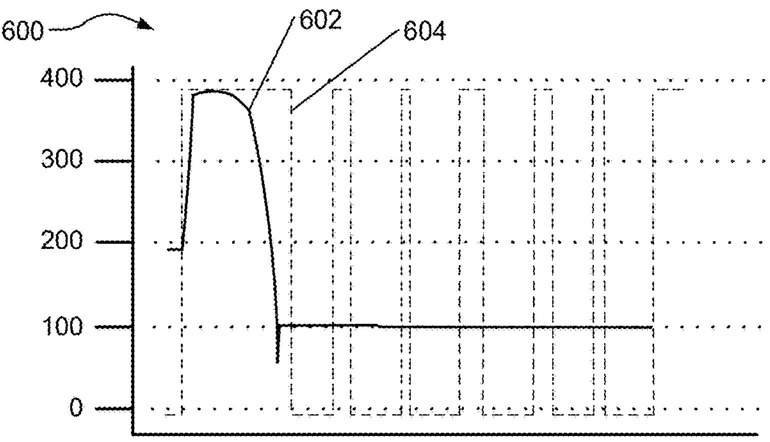
FIGS. 6-7 are graphs illustrating positive and negative mid pack voltages of the battery pack in the system of FIG. 5, according to the present disclosure.
Figure 7:
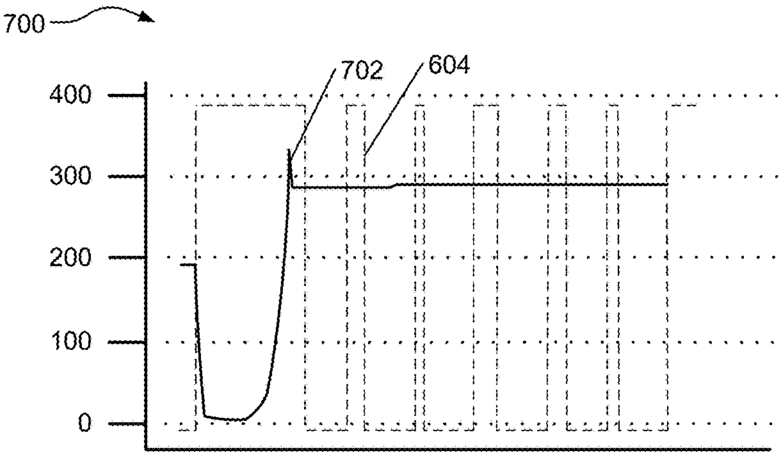

FIGS. 6-7 illustrate example graphs 600, 700 of positive and negative mid pack voltages along with a state of the switching device 508 over time. Specifically, in FIG. 6, the graph 600 depicts a positive mid pack voltage 602 and a switch state 604. As shown, the positive mid pack voltage 602 initially increases to nearly 400 V and decreases and stabilizes at about 100 V when the switching device 508 is on. In FIG. 7, the graph 700 depicts a negative mid pack voltage 702 and the switch state 604. As shown, the negative mid pack voltage 702 initially decreases to zero volts and then increases and stabilizes at about 285 V when the switching device 508 is on.

With continued reference to FIGS. 1 and 5, the control module 106 may utilize the positive and negative mid pack voltages for determining the cell location of failure only if the positive and negative mid pack voltages meet certain parameters. For example, in some examples, the control module 106 may use the mid pack voltages only if the slope of the voltage signals representing the positive and negative mid pack voltages are below a defined threshold (e.g., nearly zero). In some examples, the defined threshold may be a calibrated value suitable to ensure the positive and negative mid pack voltages have leveled off (e.g., transient conditions are minimized, etc.). In such examples, the control module 106 may determine slopes of the voltage signals representing the positive and negative mid pack voltages, such as the mid pack voltages 602, 702, by monitoring the signals over time. Then, in response to the slopes being less than or equal to the defined threshold, the control module 106 may measure (or otherwise employ) the positive mid pack voltage (e.g., the voltage 602 of FIG. 6) and the negative mid pack voltage (e.g., the voltage 702 of FIG. 7) of the battery pack 102.

For example, the control module 106 may determine the slope of the mid pack voltages 602, 702 via one or more calculations. As one example, the control module 106 may determine the slopes based on equation (1) below. In equation (1), NMPV represents the negative mid pack voltage, PMPV represents the positive mid pack voltage, Cell_N represents the total number of battery cells in the battery pack 102, and deltaCal represents a defined slope threshold. As shown, ratios based on NMPV, PMPV, and Cell_N are determined at different discrete times, and a slope is determined based on a difference between the ratios. This slope is then compared to the defined slope threshold.

$$\left|\left(\frac{NMPV}{NMPV+PMPV}\times \text{Cell\_N}\right)_t - \left(\frac{NMPV}{NMPV+PMPV}\times \text{Cell\_N}\right)_{t-1}\right| < deltaCal \quad \text{Equation (1)}$$

Then, the control module 106 may determine a defined ratio of the voltage values sensed by the voltage sensor 104. In various embodiments, this determination may be made after the determined slope of the voltage values has settled to below the defined threshold as explained above.

In the example of FIGS. 1 and 5, the control module 106 may determine this defined ratio in different manners based on whether the battery cells are balanced. For example, if the battery cells are balanced such that all of the cells in the battery pack 102 have the same voltage, the defined ratio may be determined according to equation (2) below. In such examples, the control module 106 may divide the negative mid pack voltage NMPV by the sum of the negative mid pack voltage NMPV and the positive mid pack voltage PMPV.

$$\text{Ratio} = \frac{NMPV}{NMPV + PMPV} \quad \text{Equation (2)}$$

In other examples, the battery cells may be imbalanced such that some of the cells in the battery pack 102 have different voltages (e.g., different than an average cell voltage). For example, the battery pack 102 may include cell groups having sets of battery cells that output different voltages. In such examples, the defined ratio may be determined according to equation (3) below. In this example, the control module 106 sums each cell group voltage ($CGV_i$) for a select amount of the cell groups (n) and then divides the summed cell group voltage by the sum of the negative mid pack voltage NMPV and the positive mid pack voltage PMPV. In this example, the select amount of the cell groups (n) is determined based on the negative mid pack voltage NMPV. For example, select amount of the cell groups (n) may be the number of battery cells summed required to meet the negative mid pack voltage NMPV without exceeding that value.

$$\text{Ratio} = \frac{\sum_{i=0}^{n} CGV_i}{NMPV + PMPV} \quad \text{Equation (3)}$$

Next, the control module 106 may determine a battery cell location of the detected failure in the battery pack 102. For example, the control module 106 may determine this cell location based on the defined ratio obtained according to equation (1) or equation (2) above and the total number of the battery cells in the battery pack 102. As one example, equation (4) below depicts the determination of the battery cell location of the failure when the battery cells are balanced. In this example, the control module 106 determines the battery cell location ($fail\_loc_{cell}$) by multiplying the defined ratio (from equation (2) by the total number of the battery cells (Cell_N) in the battery pack 102. In other examples, when the battery cells are imbalanced, the control module 106 can determine the battery cell location ($fail\_loc_{cell}$) by multiplying the defined ratio (from equation (3) by the total number of the battery cells (Cell_N) in the battery pack 102, as shown in equation (5) below.

$$\text{Fail\_Loc}_{Cell} = \frac{NMPV}{NMPV + PMPV} \times \text{Cell\_N} \quad \text{Equation (4)}$$

$$\text{Fail\_Loc}_{Cell} = \frac{\sum_{i=0}^{n} CGV_i}{NMPV + PMPV} \times \text{Cell\_N} \quad \text{Equation (5)}$$

Figure 8:
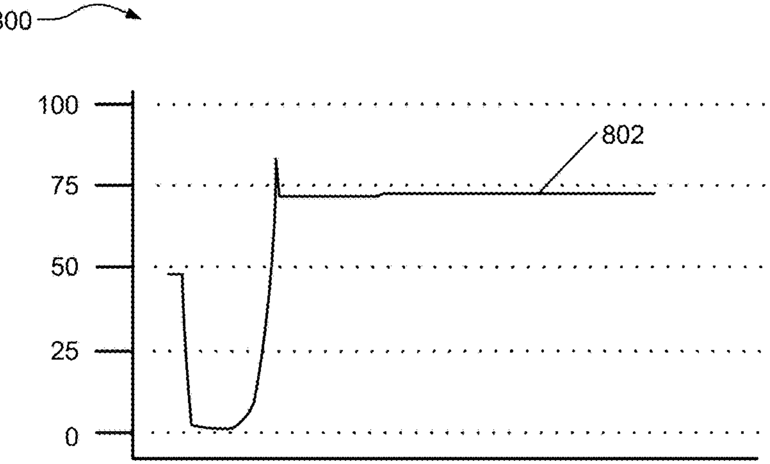
FIG. 8 is a graph illustrating a determined battery cell location of the battery pack in the system of FIG. 5, according to the present disclosure.

For example, FIG. 8 depicts an example graph 800 representing a determined battery cell location 802 of a failure in the battery pack 102 over time. In this example, the battery pack 102 includes a total of ninety-six battery cells (Cell_N=96), the negative mid pack voltage NMPV is about 285.7 volts, and the positive mid pack voltage PMPV is about 100.3 volts. If the control module 106 employs equation (4) above, the battery cell location is determined to be 71. As such, in this example, the control module 106 determines that the 71st cell from one end of the battery pack 102 is the location of the failure.

In various embodiments, the control module 106 generates an alert indicating the battery cell location of the detected failure. In such examples, the control module 106 may transmit the alert (e.g., a signal) to the alert module 108. In response, the alert module 108 provides a notification (e.g., a message) indicating the battery cell location of the detected failure to, for example, a user (e.g., a technician, etc.). For example, the alert module 108 may include a display for providing a visual and/or an audible notification. In other examples, the alert module 108 may include a speaker for providing an audible notification. Regardless of the type of notification employed, the user may be notified that a particular battery cell (e.g., the battery cell 71) has a malfunction, needs to be replaced, needs to be inspected, etc. In response, the user may replace only the particular battery cell with the detected failure or a single battery group with the particular battery cell with the detected failure.

Additionally, in some examples, the control module 106 may generally discern between different types of failure modes within the battery pack 102 due to the isolation loss. As such, the control module 106 can identify a type of the failure associated with the battery pack 102. To do so, the control module 106 may monitor one or more isolation characteristics of the entire battery pack 102 and the location of the detected failure (e.g., of the isolation loss) over two or more cycles.

For example, the control module 106 may monitor the location of the detected failure over two or more cycles only if certain conditions apply. As one example, the control module 106 receives one or more thresholds (e.g., control limits) generated through machine learning techniques, statistical modeling, etc. For example, the control module 106 may receive one or more thresholds relating to an isolation resistance derived from analysis associated with isolation resistance data obtained from other operating battery packs. In such examples, the control module 106 may begin monitoring the location of the detected failure when the isolation resistance of the battery pack 102 falls below a threshold or falls and remains below a threshold for a period of time.

Then, the control module 106 observes where the location of the isolation loss (or more generally the detected failure) is occurring over multiple cycles. For example, after determining an initial battery cell location of the isolation loss in the battery pack 102, the control module 106 may determine at least one subsequent battery cell location of the isolation loss in the battery pack 102 at a later time. In such examples, the control module 106 may determine the initial and subsequent battery cell locations as explained above.

The control module 106 then identifies a type of the failure associated with the battery pack based on the initial and subsequent battery cell locations. For example, the control module 106 can generally predict a type of the failure (e.g., a cause of the isolation loss) based on whether the determined battery cell locations are static or dynamic. In such examples, the initial and subsequent battery cell locations may be compared by the control module 106. For instance, if the initial and subsequent battery cell locations are determined to be at the same or nearly the location (e.g., static), the control module 106 may identify the type of the failure associated with the battery pack 102 as being a first type of the failure indicative of a nonmoving issue, such as corrosion, an electrolyte leak, etc. If, however, the initial and subsequent battery cell locations are determined to be at different locations (e.g., dynamic), the control module 106 may identify the type of the failure associated with the battery pack 102 as being a second type of the failure indicative of a moving issue, such as a coolant leak, water intrusion, etc.

Then, in various embodiments, the control module 106 may generate an alert indicating the type of the failure associated with the battery pack 102. For example, the control module 106 may transmit the alert to the alert module 108. In such examples, the generated alert may include the battery cell location(s) of the detected failure and/or the type of the failure associated with the battery pack 102. In response, the alert module 108 may provide a notification indicating the type of the failure to, for example, a user (e.g., a technician, etc.) as explained above. With this information, the severity of the isolation loss may be determined with a high degree of confidence and appropriate DTC and/or prognostics may be set accordingly.

Figure 9:
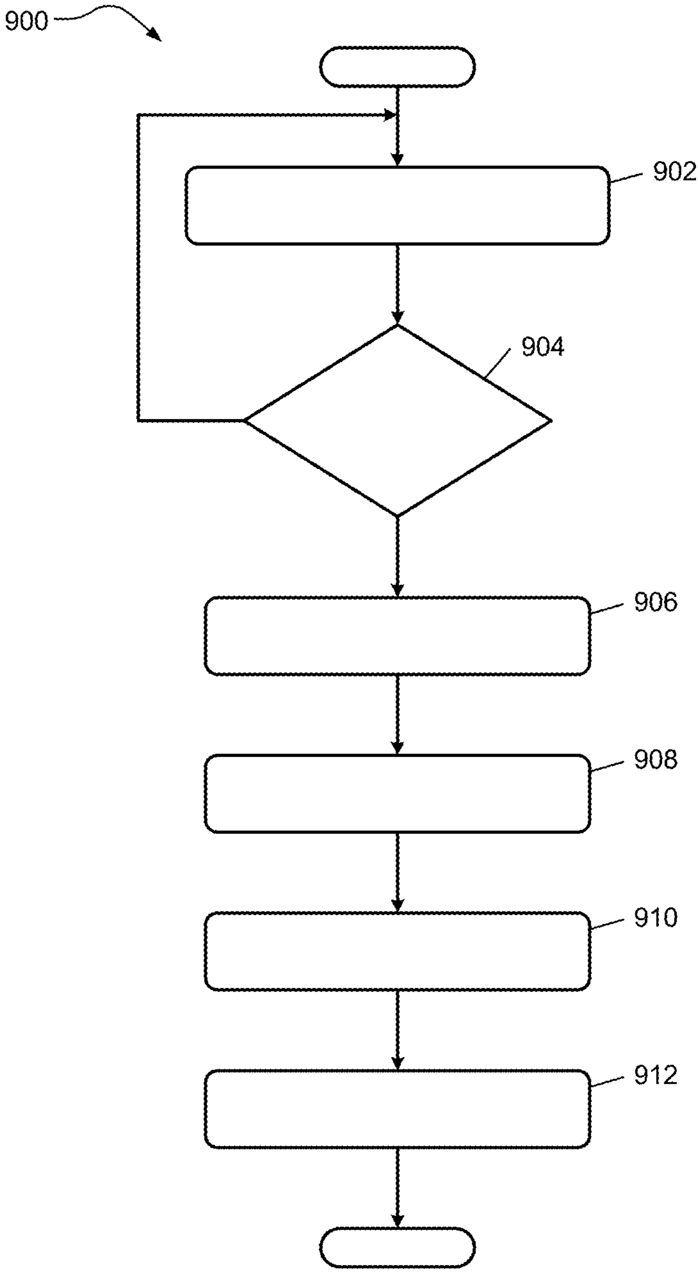
FIGS. 9-10 are flowcharts of example control processes for detecting a battery cell location failure, according to the present disclosure.
Figure 10:
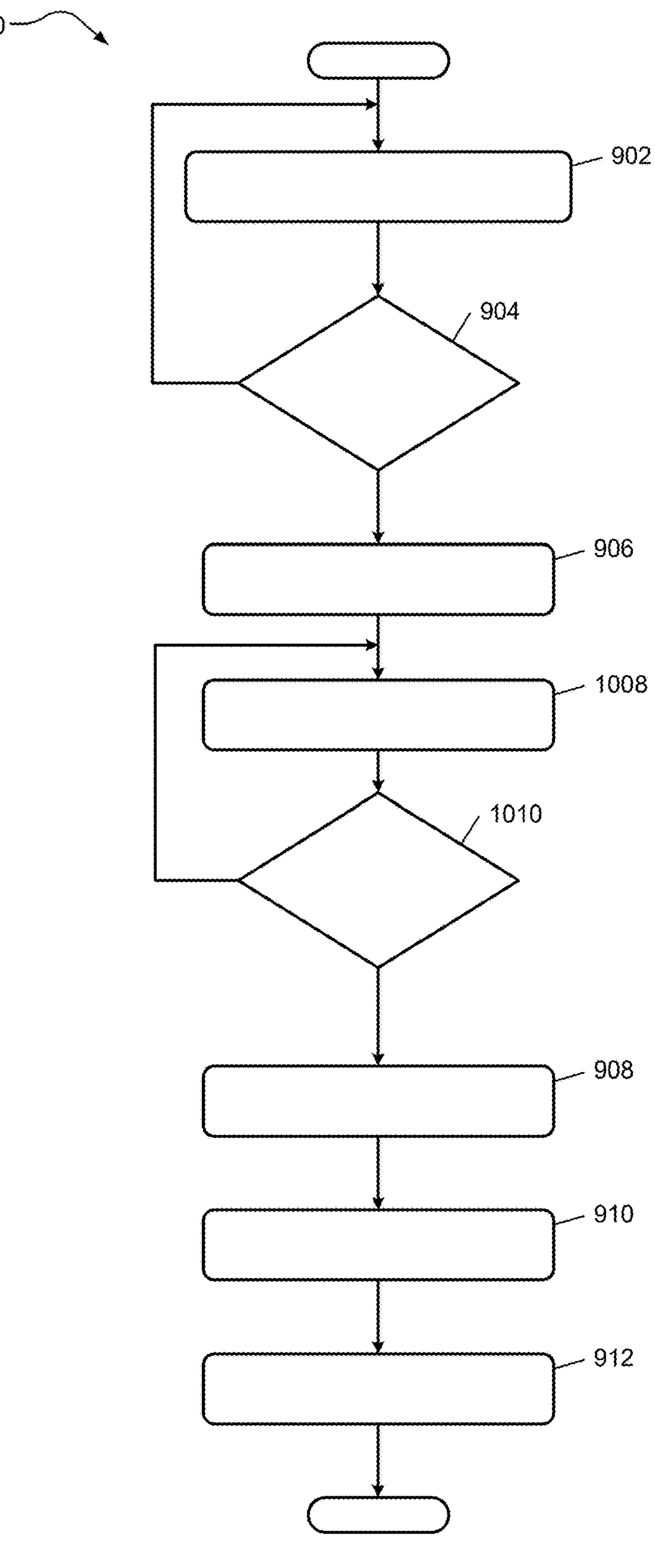
Figure 11:
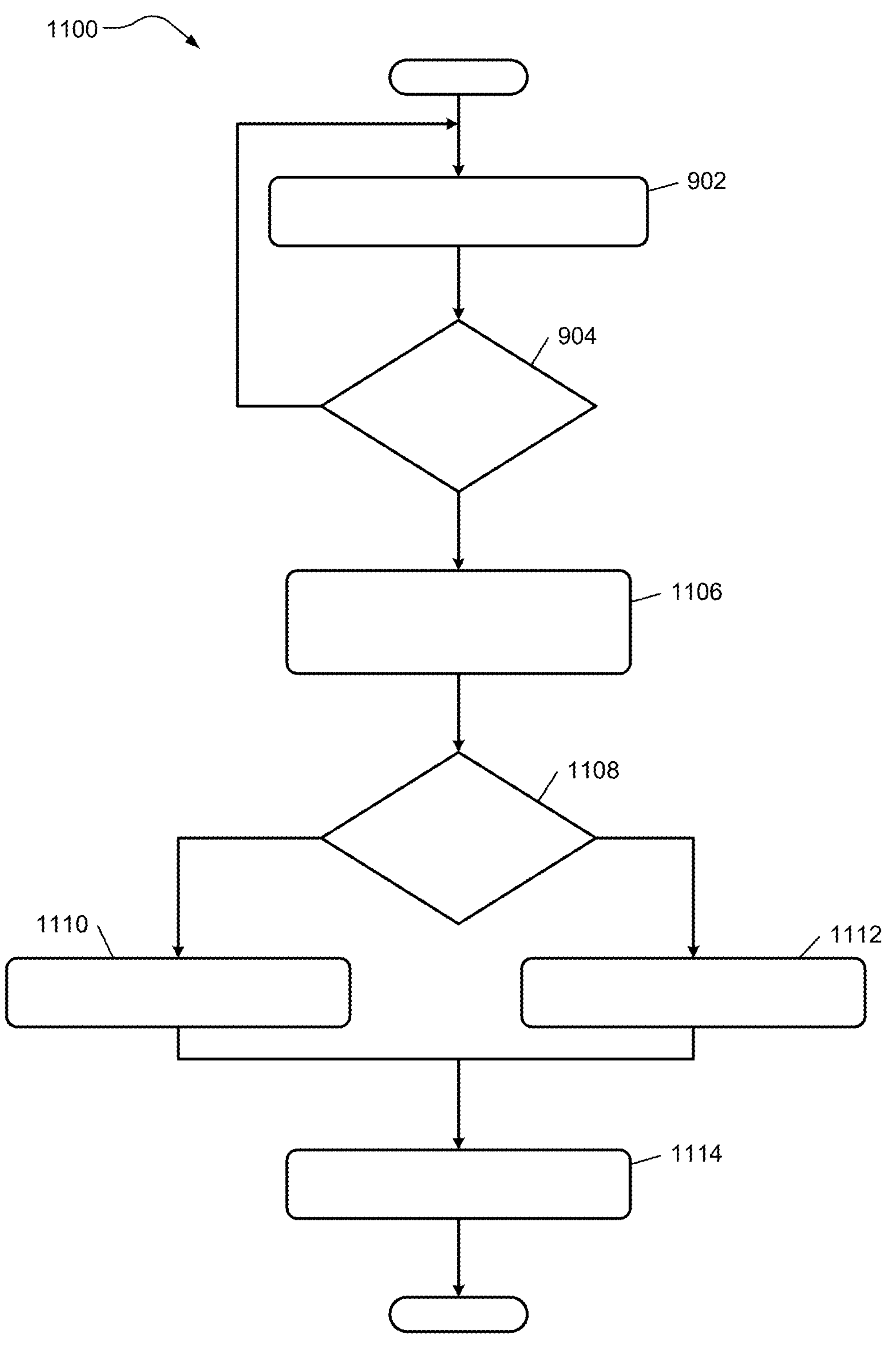
FIG. 11 is a flowchart of an example control process for identifying a failure mode in a battery pack, according to the present disclosure.

FIGS. 9-11 illustrate example control processes 900, 1000, 1100 employable by the system 100 of FIG. 1 for detecting a location failure and/or identifying a failure mode in a battery pack. Although the example control processes 900, 1000, 1100 are described in relation to the system 100 of FIG. 1 including the control module 106, any one of the control processes 900, 1000, 1100 may be employable by another suitable system.

As shown in FIG. 9, the control process 900 begins by receiving data relating to an isolation loss in a battery pack, such as the battery pack 102 of FIG. 1. For example, and as explained above, the control module 106 may receive a signal indicating an isolation loss from another module or system, sensed one or more parameters (e.g., a negative mid pack voltage, a positive mid pack voltage, etc.) associated with the battery pack, one or more thresholds learned from isolation resistance data and analysis associated with other operating battery packs, etc. The control process 900 then proceeds to 904.

At 904, the control module 106 determines whether an isolation loss is detected based on the received data. For example, and as explained herein, the control module 106 can detect the isolation loss based on the received signal, the sensed parameters, the thresholds, etc. For instance, to determines whether an isolation loss exists, the control module 106 may determine an isolation resistance based on the sensed parameters, and then compare that isolation resistance to a threshold (e.g., a user defined threshold, a learned threshold, etc.). If an isolation loss is not detected at 904, control returns to 902. Otherwise, if an isolation loss is detected, control proceeds to 906.

At 906, the control module 106 receives signals representing voltage values of the battery pack 102 from the voltage sensor 104. For example, and as explained above, the control module 106 may receive a negative mid pack voltage and a positive mid pack volage of the battery pack 102 when the voltage sensor 104 is controlled (via a bias switching device) in different switchable voltage divider configurations. The control process 900 then proceeds to 908, 910.

At 908, the control module 106 determines a ratio associated with the received voltage values. For example, and as explained above, the control module 106 may implement equation (2) or equation (3) above to obtain this ratio. At 910, the control module 106 determines a battery cell location of the detected isolation loss in the battery pack 102 based on the determined ratio and a total number of the battery cells in the battery pack 102. In various embodiments, the control module 106 may implement equation (4) or equation (5) above to obtain this battery cell location. The control process 900 then proceeds to 912.

At 912, the control module 106 generates and transmits an alert indicating the battery cell location of the detected isolation loss in the battery pack 102. For example, and as explained above, the control module 106 may generate and transmit an alert signal to the alert module 108 which in turn may provide a notification (e.g., a message) to a user indicating the battery cell location of the detected isolation loss. In such examples, the user may be notified that a particular battery cell has a malfunction, needs to be replaced, needs to be inspected, etc. In response, the user may replace only that particular battery cell causing the isolation loss or a single battery group with the particular battery cell causing the isolation loss. The control process 900 may then end as shown in FIG. 9 or return to another suitable step to continue monitoring and determining cell locations.

In FIG. 10, the control process 1000 is similar to the control process 900 of FIG. 9 but includes additional steps. For example, and as shown in FIG. 10, the control process 1000 begins at 902 and then proceeds to 904, 906 as explained above relative to FIG. 9. The control process 1000 then proceeds to 1008.

At 1008, the control module 106 determines slopes of the signals representing the voltage values, such as positive and negative mid pack voltages of the battery pack 102. For example, and as explained above, the control module 106 may determine a slope based on equation (1) above. Then, the control process 1000 proceeds to 1010 where the control module 106 determines whether the determined slopes are less than a defined (e.g., calibrated) threshold. In various embodiments, the control module 106 may make this determination based on a comparison between the determined slope (e.g., delta) and the threshold. If no at 1010, control may return to 1008 as shown in FIG. 10. If yes at 1010, the control process 1000 proceeds to 908, 910, 912 as explained above relative to FIG. 9. The control process 1000 may then end as shown in FIG. 10 or return to another suitable step to continue monitoring and determining cell locations.

In FIG. 11, the control process 1100 is implemented to identify a failure mode in the battery pack 102. For example, as shown in FIG. 11, the control process 1100 begins at 902 and then proceeds to 904 as explained above relative to FIG. 9. The control process 1100 then proceeds to 1106, where the control module 106 determines cell locations of a detected isolation loss multiple times. For example, and as explained above, the control module 106 may determine an initial battery cell location of the isolation loss in the battery pack 102 and then determine at least one subsequent battery cell location of the isolation loss in the battery pack 102 later in time. In such examples, the control module 106 may determine the initial and subsequent battery cell locations according to the steps 906, 908, 910 of FIG. 9 explained above. The control process 1100 then proceeds to 1108.

At 1108, the control module 106 determines whether the cell locations are different. For example, one cell location associated with a detected isolation loss may be at cell number 71 (of 96 total cells) of the battery pack 102, whereas a subsequent cell location associated with the detected isolation loss may be at cell number 34 of the same battery pack 102. Alternatively, one cell location associated with a detected isolation loss may be at cell number 71 of the battery pack 102, and a subsequent cell location associated with the detected isolation loss may be at cell number 71 of the same battery pack 102. Based on the cell locations, the control module 106 may identify a type of the failure (e.g., a cause of the failure) associated with the battery pack 102. For instance, if the initial and subsequent battery cell locations are different, then the control process 1100 proceeds to 1110 where the control module 106 identifies a type of the failure associated with the battery pack 102 as being a first type of the failure indicative of a moving issue, such as a coolant leak, water intrusion, etc. If, however, the initial and subsequent battery cell locations are the same or substantially the same (i.e., not different), then the control process 1100 proceeds to 1112 where the control module 106 identifies a type of the failure associated with the battery pack 102 as being a second type of the failure indicative of a nonmoving issue, such as corrosion, an electrolyte leak, etc. Then, regardless of the identified type of the failure, the control process 1100 proceeds to 1114.

At 1114, the control module 106 generates and transmits an alert indicating the identified type of the failure in the battery pack 102. For example, and as explained above, the control module 106 may generate and transmit an alert signal to the alert module 108 which in turn may provide a notification (e.g., a message) to a user indicating the type of the failure. In some examples, the alert may indicate the cell location(s) in addition to the type of the failure if desired. In response, the user may confidently determine the severity of the isolation loss and/or set an appropriate DTC for taking appropriate remedial actions.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java@, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A vehicle system for detecting a failure in a battery pack, the vehicle system comprising:
- a battery pack including a plurality of battery cells;
- a voltage sensor configured to sense an output voltage of the plurality of battery cells; and
- a control module in communication with the voltage sensor, the control module configured to:
  - detect a failure associated with the battery pack;
  - receive, from the voltage sensor, a first voltage signal representing a negative mid pack voltage of the battery pack and a second voltage signal representing a positive mid pack voltage of the battery pack;
  - determine slopes of the first voltage signal and the second voltage signal;
  - in response to the slopes being less than or equal to a defined threshold, measure the negative mid pack voltage of the battery pack from the first voltage signal and the positive mid pack voltage of the battery pack from the second voltage signal;
  - determine a defined ratio of the negative mid pack voltage and the positive mid pack voltage by dividing the negative mid pack voltage by the sum of the negative mid pack voltage and the positive mid pack voltage;
  - determine a battery cell location of the detected failure in the battery pack based on the defined ratio and a total number of the plurality of battery cells in the battery pack; and
  - generate an alert indicating the battery cell location of the detected failure.

2. The vehicle system of claim 1, wherein the control module is configured to determine the battery cell location by multiplying the defined ratio by the total number of the plurality of battery cells in the battery pack.

3. The vehicle system of claim 1, wherein:
- the voltage sensor includes a voltage divider having a plurality of resistors;
- the vehicle system further includes a switching device coupled to the voltage divider; and
- the control module is configured to control the switching device to connect different sets of the plurality of resistors in the voltage divider.

4. The vehicle system of claim 1, wherein:
- the battery cell location is a first battery cell location; and
- the control module is configured to:
  - determine a second battery cell location of the detected failure in the battery pack after determining the first battery cell location; and
  - identify a type of the failure associated with the battery pack based on the first battery cell location and the second battery cell location.

5. The vehicle system of claim 4, wherein the control module is configured to:
- determine whether the first battery cell location and the second battery cell location are the same;
- in response to the first battery cell location and the second battery cell location being the same, identify the type of the failure associated with the battery pack as being a first type of the failure; and
- in response to the first battery cell location and the second battery cell location being different, identify the type of the failure associated with the battery pack as being a second type of the failure.

6. The vehicle system of claim 4, wherein the control module configured to generate the alert indicating the type of the failure associated with the battery pack cell location of the detected failure.

7. The vehicle system of claim 5, wherein the first type of the failure includes corrosion in the battery pack or an electrolyte leak in the battery pack.

8. The vehicle system of claim 5, wherein the second type of the failure includes a coolant leak in the battery pack or water intrusion into the battery pack.

9. A method for detecting a failure in a battery pack including a plurality of battery cells, the method comprising:
- detecting a failure associated with the battery pack, the battery pack including cell groups each comprising a different set of the battery cells;
- receiving, from a voltage sensor, a first voltage signal representing a negative mid pack voltage of the battery pack and a second voltage signal representing a positive mid pack voltage of the battery pack;
- determining slopes of the first voltage signal and the second voltage signal;
- in response to the slopes being less than or equal to a defined threshold, measuring the negative mid pack voltage of the battery pack from the first voltage signal and the positive mid pack voltage of the battery pack from the second voltage signal;
- determining a defined ratio of the negative mid pack voltage and the positive mid pack voltage by summing a cell group voltage for a select amount of the cell groups and dividing the summed cell group voltage by the sum of the negative mid pack voltage and the positive mid pack voltage;
- determining a battery cell location of the detected failure in the battery pack multiplying the defined ratio by a total number of the plurality of battery cells in the battery pack; and
- generating an alert indicating the battery cell location of the detected failure.

10. The method of claim 9, wherein:
the battery cell location is a first battery cell location; and
the method further includes determining a second battery cell location of the detected failure in the battery pack and identifying a type of the failure associated with the battery pack based on the first battery cell location and the second battery cell location.

11. The method of claim 10, wherein generating the alert includes generating the alert includes indicating the type of the failure associated with the battery pack.

12. The method of claim 10, wherein:
the first battery cell location and the second battery cell location are determined at different times;
the method further includes determining whether the first battery cell location and the second battery cell location are the same; and
identifying the type of the failure associated with the battery pack includes identifying a first type of the failure associated with the battery pack in response to the first battery cell location and the second battery cell location being the same or identifying a second type of the failure associated with the battery pack in response to the first battery cell location and the second battery cell location being different.

13. The method of claim 12, wherein the first type of the failure includes corrosion in the battery pack or an electrolyte leak in the battery pack.

14. The method of claim 9, wherein:
the voltage sensor includes a voltage divider having a plurality of resistors; and
controlling a switching device to connect different sets of the plurality of resistors in the voltage divider to obtain the first voltage signal and the second voltage signal.

15. A method comprising:
detecting a failure associated with a battery pack including a plurality of battery cells;
determining N battery cell locations of the detected failure in the battery pack over time, wherein N is an integer greater than two;
identifying a type of the failure associated with the battery pack based on the N battery cell locations; and
generating an alert indicating the type of the failure associated with the battery pack.

16. The method of claim 15, wherein:
the N battery cell locations include at least a first battery cell location and a second battery cell location;
the method further includes determining whether the first battery cell location and the second battery cell location are the same; and
identifying the type of the failure associated with the battery pack includes identifying a first type of the failure associated with the battery pack in response to the first battery cell location and the second battery cell location being the same or identifying a second type of the failure associated with the battery pack in response to the first battery cell location and the second battery cell location being different.

17. The method of claim 16, wherein the first type of the failure includes corrosion in the battery pack or an electrolyte leak in the battery pack.

18. The method of claim 16, wherein the second type of the failure includes a coolant leak in the battery pack or water intrusion into the battery pack.

19. The method of claim 15, wherein determining N battery cell locations of the detected failure in the battery pack over time includes, for at least one of the N battery cell locations:
receiving, from a voltage sensor, a first voltage signal representing a first voltage value and a second voltage signal representing a second voltage value;
determining a defined ratio of the first voltage value and the second voltage value; and
determining the at least one of the N battery cell locations in the battery pack based on the defined ratio and a total number of the plurality of battery cells in the battery pack.

20. The method of claim 19, wherein:
the voltage sensor includes a voltage divider having a plurality of resistors; and
controlling a switching device to connect different sets of the plurality of resistors in the voltage divider to obtain the first voltage signal and the second voltage signal.

* * * * *